United States Patent
Agarwal

(10) Patent No.: US 8,258,798 B2
(45) Date of Patent: Sep. 4, 2012

(54) ON CHIP DUTY CYCLE MEASUREMENT MODULE

(75) Inventor: Nitin Agarwal, Uttar Pradash (IN)

(73) Assignee: STMicroelectronics International N.V., Amsterdam (NL)

( * ) Notice: Subject to any disclaimer, the term of this patent is extended or adjusted under 35 U.S.C. 154(b) by 581 days.

(21) Appl. No.: 11/964,127

(22) Filed: Dec. 26, 2007

(65) Prior Publication Data

US 2008/0218151 A1 Sep. 11, 2008

(30) Foreign Application Priority Data

Dec. 28, 2006 (IN) .................. 2821/DEL/2006

(51) Int. Cl.
*G01R 27/26* (2006.01)
*G01R 25/00* (2006.01)

(52) U.S. Cl. ......................... 324/678; 702/79

(58) Field of Classification Search .............. 324/72, 324/765; 327/35, 170; 340/870.37; 320/166; 702/79
See application file for complete search history.

(56) References Cited

U.S. PATENT DOCUMENTS 7,148,697 B2 * 12/2006 Doljack .................... 324/548
7,420,400 B2 * 9/2008 Boerstler et al. .......... 327/175

* cited by examiner

*Primary Examiner* — Jeff Natalini
(74) *Attorney, Agent, or Firm* — Wolf, Greenfield & Sacks, P.C.

(57) ABSTRACT

A method and a circuit for measuring an on chip duty cycle. The circuit includes a capacitor, a switching circuit, a current source, a comparator circuit and a counter. The circuit receives a first clock signal and a second clock signal. The first clock signal has a 50% duty cycle and the second signal has an unknown duty cycle signal. The switching circuit first receives the first clock signal and then the second clock signal for measuring the duty cycle. The comparator circuit compares a comparator voltage with a reference voltage for the first clock signal to measure a first elapsed cycle using the counter. The comparator circuit again compares a comparator voltage with a reference voltage for the second clock signal to measure a second elapsed cycle using the counter. The counter measures the first elapsed cycle and the second elapsed cycle corresponding to the first clock signal and the second clock signal for a duration in which the comparator voltage equals the reference voltage. The duty cycle for the second clock signal is then calculated using the first elapsed cycle and the second elapsed cycle.

19 Claims, 4 Drawing Sheets

ON CHIP DUTY CYCLE MEASUREMENT MODULE

BACKGROUND OF THE INVENTION

1. Field of the Invention

The present invention relates to electronic circuits and more specifically to a method and system for an on chip measurement of duty cycle for an unknown clock signal.

2. Discussion of the Related Art

In the manufacturing of electronic components there is a need for measuring electrical signal parameters. By comparing the measured parameters with the expected values, the accurate operations of the components can be detected. So during fabrication process an accurate and innovative circuit can be designed using these techniques.

The measurement of a clock duty cycle is one of the essential signal parameter that needs to be analyzed. The duty cycle of a clock signal is a ratio of an on time to a total time period of a clock cycle. Integrated circuits rely on clock generators to provide the clock signal. The clock generators can include a phase locked loop (PLL) device or an oscillator.

The duty cycle of high frequency clocks obtained from a PLL system is very critical in terms of obeying the timing constraints in the applications. In the case of Double Data Rate (DDR) applications, where both the positive and negative edges of the clock are used, the duty cycle assumes even more importance.

The duty cycle in synchronous digital systems is extremely critical, when logic is synchronous to both the rising and falling edges of the clock. Even a slight error in the duty cycle can create a major difference in the speed of the system clock and thereby causing a significant impact on the performance of the designed circuit. For instance, a duty cycle error of just 5% can cause the system clock to run at a maximum speed that can be 10% lower than the desired maximum speed. Further, many circuits require a specific duty cycle for the clock signals to provide an optimal performance. Therefore, it is very essential to measure an accurate duty cycle for a circuit.

The duty cycle of the clock signal also depends on several other factors such as temperature, loading, circuit design, etc. Therefore, to properly account for the affects that vary the duty cycle, an accurate measurement of the duty cycle during normal operation is necessary.

Off chip measurement of the duty cycle of a high frequency clocks would not be accurate because of the contribution of the additional buffers required to drive these signals in the real world.

Therefore, there is a need for a novel on-chip duty cycle measurement technique for accurately measuring the duty cycle of an unknown clock signal. The novel technique employs a robust logic for enhancing the measurement capabilities with respect to supply voltages, processes and temperature variations.

SUMMARY OF THE INVENTION

It is an object of the present invention to provide a technique utilizing a simple circuit for measuring an on chip duty cycle.

To achieve the aforementioned objective, the present invention provides a method of measuring a duty cycle of a first clock signal comprising:

charging a capacitor to a first voltage level;

discharging the capacitor to a second voltage level by applying a reference clock signal;

measuring a number of clock cycles (N1) of said reference clock signal elapsed during the discharging of said capacitor from the first voltage level to the second voltage level;

recharging said capacitor to the first voltage level;

discharging said capacitor to the second voltage level by applying a first clock signal of an unknown duty cycle;

measuring a number of clock cycles (N2) of said first clock signal elapsed during the discharging of said capacitor from the first voltage level to the second voltage level; and calculating said duty cycle of said first clock signal from the number of clock cycles (N1) and the number of clock cycles (N2).

Further the present invention provides a method of measuring a duty cycle of a first clock signal comprising:

charging a capacitor to a first voltage level;

discharging the capacitor to a second voltage level by applying the first clock signal of an unknown duty cycle;

measuring a number of clock cycles (N1) of said first clock signal elapsed during the discharging of said capacitor from the first voltage level to the second voltage level;

recharging said capacitor to the first voltage level;

discharging said capacitor to the second voltage level by applying a second signal, said second signal being complementary to the first clock signal;

measuring a number of clock cycles (N2) of said second clock signal elapsed during the discharging of said capacitor from the first voltage level to the second voltage level; and calculating the duty cycle of said first clock signal from the number of clock cycles (N1) and the number of clock cycles (N2).

Further the present invention provides a method of measuring a duty cycle of a first clock signal comprising:

modifying a voltage level across a capacitor from a first voltage level to a second voltage level by applying said first clock signal and measuring a number of cycles (N1) of said first clock signal elapsed during a change in the voltage level across the capacitor;

modifying the voltage level across said capacitor to the first voltage level;

modifying the voltage level across said capacitor from said first voltage level to the second voltage level by applying a second clock signal and measuring the number of cycles (N2) of said second clock signal elapsed during a change in the voltage level across the capacitor; and calculating the duty cycle of said first clock signal from the number of clock cycles (N1) and the number of clock cycles (N2).

Further the present invention provides a circuit for measuring a duty cycle of a first clock signal of an unknown duty cycle comprising:

a capacitor receiving a supply voltage for charging;

a switching circuit connected to said capacitor for controlling a current, said switching circuit receiving a reference clock signal and the first clock signal;

a current source connected to said switching circuit to drain the current to a ground terminal;

a comparator circuit operatively coupled to said capacitor and said switching circuit for comparing a comparator voltage with a reference voltage for the reference clock signal and the first clock signal; and a counter operatively coupled to said comparator circuit for measuring a first elapsed cycle (N1) for the reference clock signal and a second elapsed cycle (N2) for the first clock signal for a specific duration to calculate the duty cycle, said duration corresponding to a cycle in which said comparator voltage equals said reference voltage.

Further the present invention provides a circuit for measuring a duty cycle of a clock signal of an unknown duty cycle comprising:

a capacitor receiving a supply voltage for charging;

a switching circuit connected to said capacitor for controlling a current, said switch receiving a clock signal and a complementary clock signal;

a current source connected to said switching circuit to drain the current to a ground terminal;

a comparator circuit operatively coupled to said capacitor and said switching circuit for comparing a comparator voltage with a reference voltage for said clock signal and said complementary clock signal; and a counter operatively coupled to said comparator circuit for measuring a first elapsed cycle (N1) for the clock signal and a second elapsed cycle (N2) for the complementary clock signal for a specific duration to calculate the duty cycle, said duration corresponding to a cycle in which said comparator voltage equals said reference voltage.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

Figure 1:
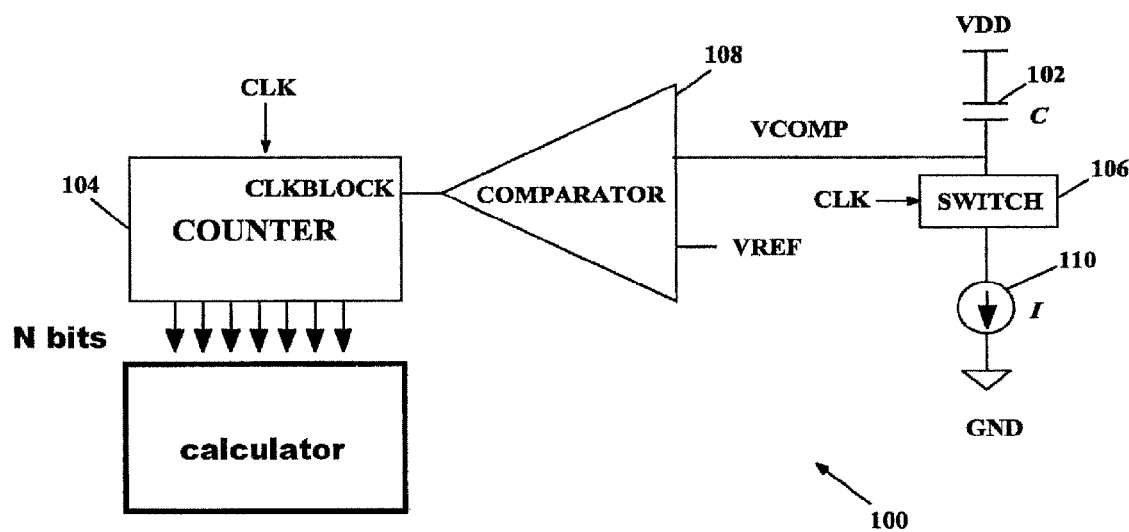
FIG. 1 illustrates a circuit diagram for measuring a duty cycle of an unknown clock signal according to embodiments of the present invention.

The preferred embodiments of the present invention will be described in detail with reference to the accompanying drawings. However, the present invention is not limited to the preferred embodiments. The present invention can be modified in various forms. The preferred embodiments of the present invention are only provided to explain more clearly the present invention to the person ordinarily skilled in the art of the present invention. In the accompanying drawings, like reference numerals are used to indicate like components.

FIG. 1 illustrates a circuit diagram 100 for measuring a duty cycle of an unknown clock signal according to embodiments of the present invention. The circuit 100 includes a capacitor 102, a counter 104, a switching circuit 106, a comparator circuit 108, and a current source 110. The circuit 100 receives a first clock signal and a second clock signal. In an embodiment of the present invention, the first clock signal has a specific duty cycle value (50% duty) and the second clock signal has an unknown duty cycle value. In another embodiment of the present invention, the first clock signal and the second clock signal can be complementary to each other with an unknown duty cycle value.

A first terminal of the capacitor 102 is connected to a supply voltage (VDD) for charging to the supply voltage (VDD). The second terminal of the capacitor 102 is connected to a comparator voltage terminal of the comparator circuit 108 and to the switching circuit 106. The switching circuit 106 is connected to the second terminal of the capacitor 102 for controlling a current. The switching circuit 106 first receives a reference clock signal and then a second clock signal. The current source 110 is connected to the switching circuit 106 to drain the current to a ground terminal. The comparator circuit 108 first compares a comparator voltage (VCOMP) with a reference voltage for the reference clock signal to measure a first elapsed cycle (N1) using the counter 104. The comparator circuit 108 then compares a comparator voltage (VCOMP) with a reference voltage for the second clock signal to measure a second elapsed cycle (N2) using the counter 104. The comparator circuit 108 compares until both the comparator voltage and the reference voltage becomes equal in both the cases. The duration in which the comparator voltage and the reference voltage for the reference clock signal and the second clock signal becomes equal corresponds to the first elapsed cycle (N1) and the second elapsed cycle (N2) respectively. The first elapsed cycle (N1) and the second elapsed cycle (N2) are then used to measure the duty cycle of the second clock signal whose duty cycle is not known.

To initialize the circuit 100, the capacitor 102 is first charged to the supply voltage VDD and the counter 104 is reset at zero level. A reference current 'I' and a reference voltage 'VREF' are switched on and sufficient time is allowed for the reference current I and the reference voltage VREF to settle to a steady state value. The first clock signal (with a duty cycle 50%) is applied simultaneously to the switching circuit 106 and to the counter 104.

During the high time of the clock, the capacitor 102 discharges from the supply voltage (VDD) by a value ('I*0.5*T1/C'), where T1 is the time period of the first clock signal VREF and C is the capacitance of the capacitor 102. In every clock cycle, the capacitor 102 will discharge by the same value, i.e., (I*0.5*T1/C). The comparator voltage VCOMP of a value VDD−[I*0.5*T1/C] is fed to an input terminal of the comparator circuit 108. The comparator circuit 108 will compare the comparator voltage VCOMP with the reference voltage VREF and the output of the comparator circuit 108 is fed to the counter 104. The capacitor 102 will discharge till the comparator voltage VCOMP becomes equal to the reference voltage VREF. The counter 104 will count the first elapsed cycle i.e. the number of elapsed clock cycles for the duration in which the comparator voltage equals the reference voltage.

When the VCOMP becomes equal to the VREF, the comparator 108 changes its state from the initial value. The new state of the comparator output CLKBLOCK, blocks the clock input to the counter 104. Thereafter, the status of the bits do not change and the logic levels of the bits gives an estimation of the number of clock cycles that elapsed for the duration in which the comparator voltage VCOMP equals the reference voltage VREF. The values of N bits are latched and read out for calculations.

The above described procedure is performed for the second clock signal whose duty cycle is to be measured. As a result, we obtain the values of the number of clock cycles, i.e., first elapsed cycle (N1), for VCOMP to equalize with VREF for the clock signal having a 50% duty cycle and the number of clock cycles, i.e., second elapsed cycle (N2), for VCOMP to equalize with VREF for the clock signal whose duty cycle is to be measured. Using N1 and N2, the duty cycle D of the clock signal with an unknown duty cycle can be calculated.

As VREF is same for both the measurement runs, $$VDD-[I*0.5*T1*n1/C]=VDD-[I*D*T2*n2/C]$$

T2 is the time period of the clock signal whose duty cycle is to be measured and D the duty cycle to be measured. Solving the above equation D is given by:

$$D=[(0.5*T1*n1)/(T2*n2)]$$

In another embodiment of the present invention, the first clock signal and the second clock signal are complementary to each other. In this manner a duty cycle of any unknown clock signal can be measured.

Figure 2:
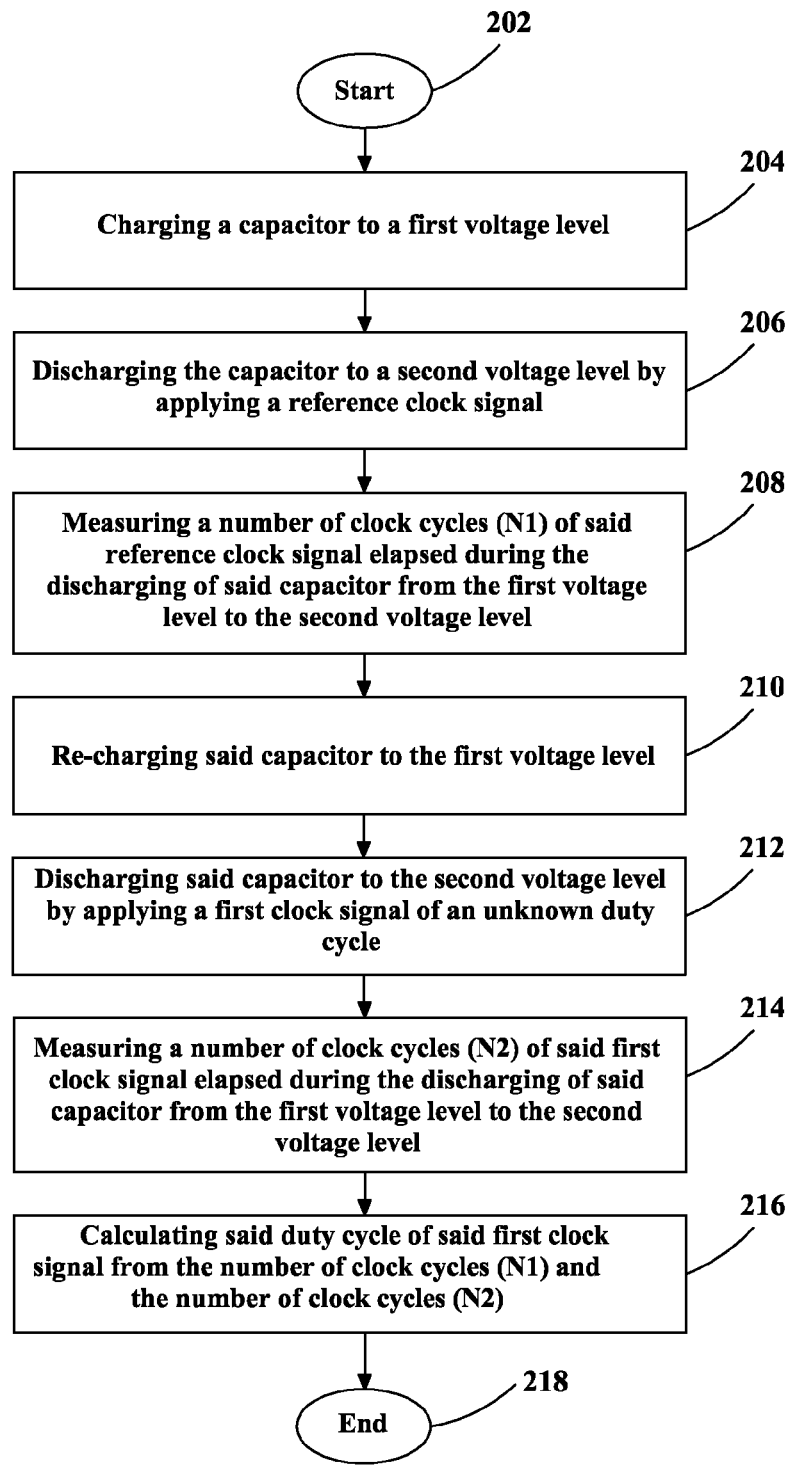
FIG. 2 illustrates a flow diagram of a method for measuring a duty cycle of an unknown clock signal according to embodiments of the present invention.

FIG. 2 illustrates a flow diagram of a method for measuring a duty cycle of an unknown clock signal according to embodiments of the present invention. At step 204, a capacitor is charged to a first voltage level. At step 206, the capacitor is discharged to a second voltage level by applying a reference clock signal. At step 208, a number of clock cycles (N1) is measured for said reference clock signal elapsed during the discharging of said capacitor from the first voltage level to the second voltage level. At step 210, the capacitor is re-charged to the first voltage level. At step 212, the capacitor is discharged to the second voltage level by applying a first clock signal of an unknown duty cycle. At step 214, a number of clock cycles (N2) is measured for said first clock signal elapsed during the discharging of said capacitor from the first voltage level to the second voltage level. At step 216, the duty cycle of said first clock signal is calculated from the number of clock cycles (N1) and the number of clock cycles (N2).

Figure 3:
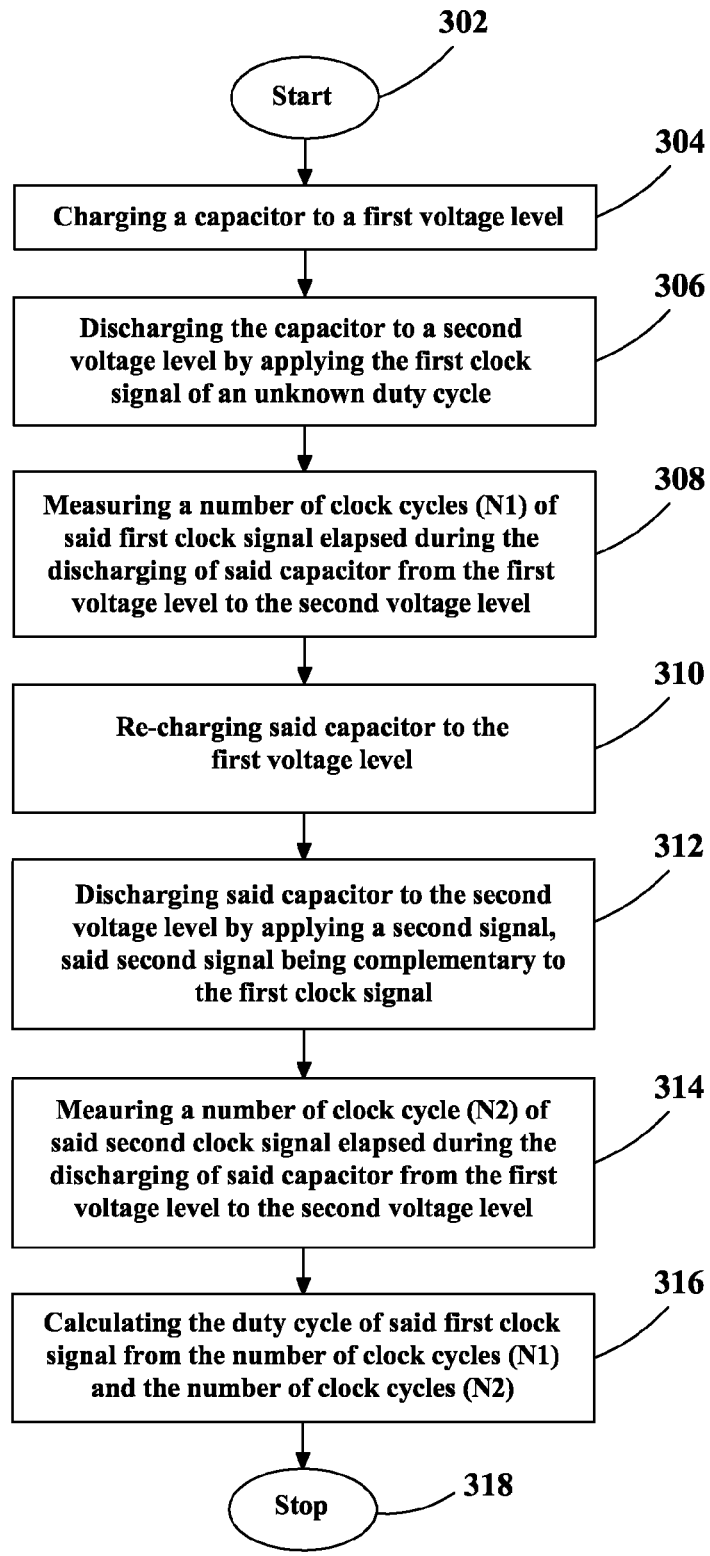
FIG. 3 illustrates a flow diagram of a method for measuring a duty cycle of an unknown clock signal according to another embodiment of the present invention.

FIG. 3 illustrates a flow diagram of a method for measuring a duty cycle of an unknown clock signal according to another embodiment of the present invention. At step 304, a capacitor is charged to a first voltage level. At step 306, the capacitor is discharged to a second voltage level by applying the first clock signal of an unknown duty cycle. At step 308, a number of clock cycles (N1) of said first clock signal is measured elapsed during the discharging of said capacitor from the first voltage level to the second voltage level. At step 310, the capacitor is recharged to the first voltage level. At step 312, the capacitor is discharged to the second voltage level by applying a second signal, said second signal being complementary to the first clock signal. At step 314, a number of clock cycles (N2) of said second clock signal is measured elapsed during the discharging of said capacitor from the first voltage level to the second voltage level. At step 316, the duty cycle of said first clock signal is calculated from the number of clock cycles (N1) and the number of clock cycles (N2).

Figure 4:
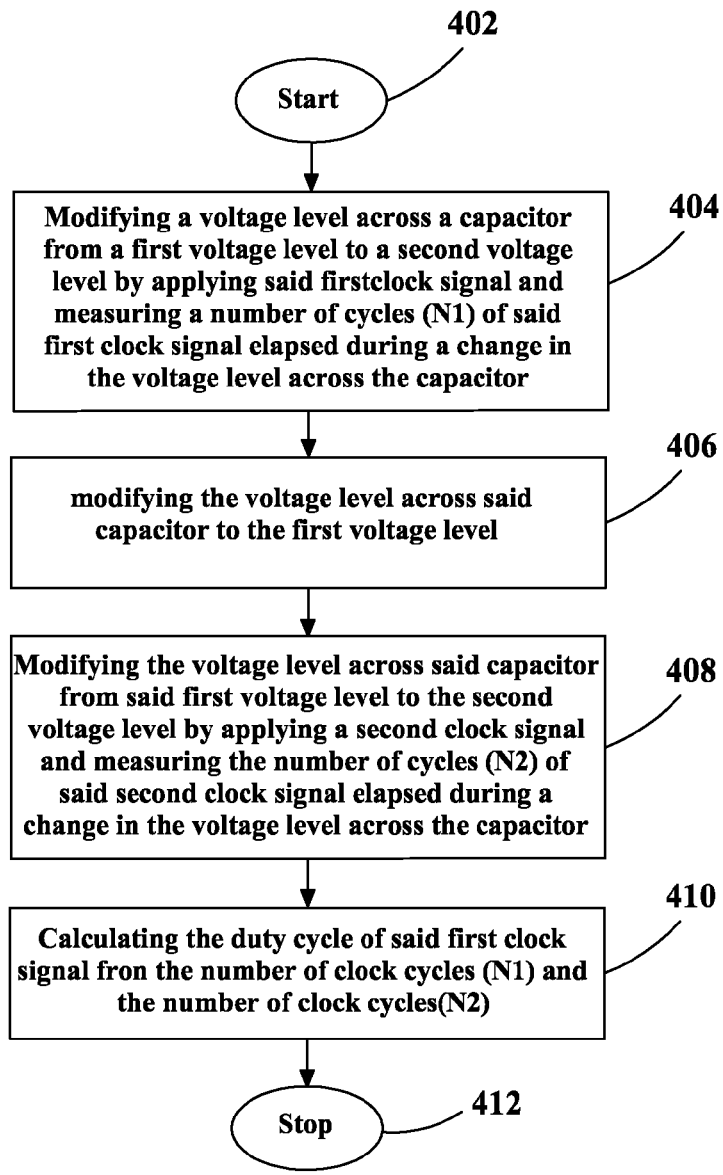
FIG. 4 illustrates a flow diagram of a method for measuring a duty cycle of an unknown clock signal according to yet another embodiment of the present invention.

FIG. 4 illustrates a flow diagram of a method for measuring a duty cycle of an unknown clock signal according to yet another embodiment of the present invention. At step 404, a voltage level across a capacitor is modified from a first voltage level to a second voltage level by applying said first clock signal and measuring a number of cycles (N1) of said first clock signal elapsed during a change in the voltage level across the capacitor. At step 406, the voltage level across said capacitor is modified to the first voltage level. At step 408, the voltage level across said capacitor is modified from said first voltage level to the second voltage level by applying a second clock signal and measuring the number of cycles (N2) of said second clock signal elapsed during a change in the voltage level across the capacitor. At step 410, the duty cycle of said first clock signal is measured from the number of clock cycles (N1) and the number of clock cycles (N2).

A technique described in embodiments of the present invention offers many advantages. First, the technique allows measuring a duty cycle inside a chip circuit, which provides an accurate estimation of the duty cycle. Second, the technique allows eliminating the mismatches in a current (I), VREF and C. Hence, this does not affect the measurement accuracy as they are cancelled out because of doing the measurement run twice (one for the known duty cycle and the other for the clock whose duty cycle is to be measured). Third, the simplicity of the scheme increases the robustness of the design with respect to supply voltage, process and temperature variations.

Although the disclosure of method and circuit has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

What is claimed is:

1. A method of measuring a duty cycle of a first clock signal comprising:
    charging a capacitor to a first voltage level;
    discharging the capacitor to a second voltage level by applying a reference clock signal;
    measuring a first number of clock cycles of said reference clock signal elapsed during the discharging of said capacitor from the first voltage level to the second voltage level with application of the reference clock signal;
    recharging said capacitor to the first voltage level;
    discharging said capacitor to the second voltage level by applying a first clock signal of an unknown duty cycle;
    measuring a second number of clock cycles of said first clock signal elapsed during the discharging of said capacitor from the first voltage level to the second voltage level with application of the first clock signal; and
    calculating said duty cycle of said first clock signal from the first number of clock cycles and the second number of clock cycles.

2. The method as claimed in claim 1, wherein said reference clock signal comprises a 50% duty cycle clock signal.

3. A circuit for measuring a duty cycle of a first clock signal of an unknown duty cycle comprising:
    a capacitor configured to receive a supply voltage for charging the capacitor to an initial value;
    a switching circuit connected to said capacitor for controlling a current to discharge the capacitor from the initial value, said switching circuit configured to receive a reference clock signal and the first clock signal;
    a current source connected to said switching circuit to drain the current to a ground terminal;
    a comparator circuit operatively coupled to a node between said capacitor and said switching circuit for comparing a capacitor voltage determined by the reference clock signal or the first clock signal with a reference voltage; and
    a counter operatively coupled to said comparator circuit for measuring a number of clock cycles occurring during a discharging period of the capacitor from the initial value and wherein the counter is terminated based on a comparison of the reference voltage and the capacitor voltage that is reduced based in part on the duty cycle of the reference clock signal or terminated based on a comparison of the reference voltage and the capacitor voltage that is reduced to based in part on the duty cycle of the first clock signal.

4. The circuit of claim 3, wherein said reference clock signal comprises a clock signal with a 50% duty cycle.

5. The circuit of claim 3, wherein the circuit is on a chip.

6. A circuit for measuring a duty cycle of a clock signal, the circuit comprising:
    a capacitor configured to receive an initial charge;
    a switch configured to discharge the capacitor based upon a clock signal;

a comparator configured to compare the voltage of the capacitor to a reference voltage, and to provide an output when the voltage of the capacitor is equal to or less than the reference voltage; and a counter coupled to the comparator and configured to measure a number of clock cycles of the clock signal that elapse during discharge of the capacitor until the voltage of the capacitor is equal to or less than the reference voltage as signaled by the output of the comparator; and a calculator configured to determine the duty cycle of the clock signal based in part on the measured number of clock cycles.

7. The circuit of claim 6, further comprising:
a voltage source for charging the capacitor; and
a voltage source for providing the reference voltage.

8. The circuit of claim 6, wherein the switch, when actuated, drains current from the capacitor.

9. A circuit for measuring a duty cycle of a clock signal, the circuit comprising:
a capacitor;
switching circuitry configured to receive at least one clock signal and modify a charge on the capacitor responsive to the at least one clock signal;
a comparator configured to compare at least one voltage of the capacitor to a reference voltage; and
a counter configured to provide at least one measure of at least one number of clock cycles during at least one period in which the voltage on the capacitor changes from a first voltage to the reference voltage; and
a calculator configured to determine the duty cycle of the at least one clock signal based in part on the measured at least one number of clock cycles.

10. The circuit of claim 9, wherein the calculator is configured to determine the duty cycle of the at least one clock signal based upon the at least one measure of the at least one number of clock cycles and at least one second measure of a second number of clock cycles associated with a reference clock signal.

11. The circuit of claim 9, wherein the capacitor, switching circuitry, comparator and counter are located on a chip that includes an integrated circuit.

12. The circuit of claim 9, wherein the switching circuitry is configured to receive a first clock signal and a second clock signal.

13. The circuit of claim 12, wherein the duty cycle of the first clock signal is known.

14. The circuit of claim 12, wherein the duty cycle of the first clock signal is known to be about 50%.

15. The circuit of claim 12, wherein the comparator is configured to compare a first voltage of the capacitor determined by the first clock signal to the reference voltage, and to compare a second voltage of the capacitor determined by the second clock signal to the reference voltage.

16. The circuit of claim 15, wherein the counter is configured to provide a first measure of a first number of clock cycles during a first period in which the voltage on the capacitor changes from the first voltage to the reference voltage, and to provide a second measure of a second number of clock cycles during a second period in which the voltage on the capacitor changes from the second voltage to the reference voltage.

17. The circuit of claim 15, wherein the calculator is configured to calculate a duty cycle of at least the first or second clock signal based upon the first measure and second measure.

18. The circuit of claim 17, wherein the calculator is configured to calculate a value representative of a ratio of the first measure to the second measure.

19. The circuit of claim 9, wherein the calculator is configured to determine a duty cycle of the at least one clock signal based upon the at least one measure of the at least one number of clock cycles and at least one second measure of a second number of clock cycles associated with a complementary signal of the clock signal.

* * * * *